United States Patent [19]
Andersson

[11] Patent Number: 5,815,581
[45] Date of Patent: Sep. 29, 1998

[54] CLASS D HEARING AID AMPLIFIER WITH FEEDBACK

[75] Inventor: Olle Andersson, Jarfalla, Sweden

[73] Assignee: Mitel Semiconductor, Inc., San Diego, Calif.

[21] Appl. No.: 545,034

[22] Filed: Oct. 19, 1995

[51] Int. Cl.[6] .................................................. H04R 25/00
[52] U.S. Cl. .......................... 381/68.4; 381/68; 330/251
[58] Field of Search ........................... 381/68.4, 96, 120, 381/121, 59, 68, 104, 107, 108; 330/251, 10

[56] References Cited

U.S. PATENT DOCUMENTS

| | | |
|---|---|---|
| 4,178,556 | 12/1979 | Attwood . |
| 4,191,856 | 3/1980 | Nagano et al. ........................ 370/114 |
| 4,415,863 | 11/1983 | Tokumo . |
| 4,523,156 | 6/1985 | Sauer . |
| 4,592,087 | 5/1986 | Killion . |
| 4,595,885 | 6/1986 | Prieto et al. . |
| 4,649,565 | 3/1987 | Kaizer et al. . |
| 4,689,819 | 8/1987 | Killion . |
| 4,731,850 | 3/1988 | Levitt et al. . |
| 4,739,511 | 4/1988 | Hori et al. . |
| 4,887,299 | 12/1989 | Cummins et al. . |
| 4,888,810 | 12/1989 | Preves . |
| 4,934,770 | 6/1990 | Anderson et al. . |
| 4,982,317 | 1/1991 | Mauthe . |
| 5,083,312 | 1/1992 | Newton et al. . |
| 5,111,506 | 5/1992 | Charpentier et al. . |
| 5,117,201 | 5/1992 | Luther . |
| 5,144,674 | 9/1992 | Meyer et al. . |
| 5,247,581 | 9/1993 | Gurcan . |
| 5,276,739 | 1/1994 | Krokstad et al. . |
| 5,278,912 | 1/1994 | Waldhauer . |
| 5,285,169 | 2/1994 | Theus . |
| 5,317,640 | 5/1994 | Callias . |
| 5,321,758 | 6/1994 | Charpentier et al. . |
| 5,378,933 | 1/1995 | Pfannenmueller et al. . |
| 5,387,875 | 2/1995 | Tateno . |
| 5,389,829 | 2/1995 | Milazzo . |
| 5,410,265 | 4/1995 | Jain et al. . |
| 5,410,592 | 4/1995 | Wagner et al. . |
| 5,432,475 | 7/1995 | Fukahori . |

FOREIGN PATENT DOCUMENTS

| | | |
|---|---|---|
| 2063512 | 3/1992 | Canada . |
| 0 504 460 A1 | 9/1992 | European Pat. Off. . |
| 2 020 505 | 11/1979 | United Kingdom . |

OTHER PUBLICATIONS

J. Bareford, (Jan. 1989), "Class–D Amplifier", *Elektor Electronics* 15(166):19–21.

J.D. Sherman, (Jan. 1995), "Class D Amplifiers Provide High Efficiency for Audio Systems", *EDN Electrical Design News* 40(11):103–106, 108, 110.

R.S. Burwen, "Kilowatts On Order", *IEEE Spectrum*, pp. 32–37 (Jan. 1993).

*Primary Examiner*—Vivian Chang
*Attorney, Agent, or Firm*—Knobbe, Martens, Olson & Bear, LLP

[57] ABSTRACT

An improved hearing aid amplifier circuit employs a Class D amplifier which includes an output to input feedback loop to minimize distortion, stabilize gain, and simplify the design requirements for several circuit elements of the Class D amplifier.

6 Claims, 5 Drawing Sheets

CLASS D HEARING AID AMPLIFIER WITH FEEDBACK

BACKGROUND OF THE INVENTION

1. Field of the Invention

The present invention relates to the implementation of power efficient, low distortion Class D amplifiers into hearing aids.

2. The Prior Art

Recently, the performance and efficiency of hearing aid amplifier circuitry has been improved with the advent of Class D pulse width modulating audio amplifiers of sufficiently small size, low distortion, and limited power requirements. General aspects of the implementation of Class D amplifiers for hearing aids are described in U.S. Pat. Nos. 4,689,819 and 4,592,087, both to Killion, the disclosures of which are hereby incorporated by reference.

In a Class D amplifier, an audio input signal is compared in a comparator to a triangle wave which has a frequency much higher than the audio band (i.e. much above approximately 20 kHz). The resulting comparator output is a square wave with a duty cycle proportional to the instantaneous value of the input signal. To power an output transducer (usually termed the "receiver"), this square wave is used to drive an H-bridge switch which connects the battery potential in one polarity across the speaker coil when the modulated square wave is high, and connects the battery potential in the opposite polarity across the speaker coil when the modulated square wave is low. The transducer coil filters the high frequency components from the signal, and an amplified audio input signal appears is emitted from the receiver.

The efficiency of Class D amplifiers makes them attractive for hearing aid use. Because the output drive transistors used in the H-bridge are driven in switching mode, they dissipate very little energy in operation. Furthermore, because the output transducer has a high impedance at the switching frequency, the current through the transducer when no input signal is present is very low, even though an AC square wave with 50% duty cycle is present across the transducer coil. Further reductions in the zero audio input current level can be made with more complex amplifier circuits, as are described, for example, in U.S. Pat. Nos. 5,317,640 to Callias and 5,387,875 to Tateno.

Class D amplifiers have several drawbacks however, including signal distortion and gain errors. Distortion can arise from several factors. If the triangle wave input to the comparator is created by a simple RC integration of a clock signal, the non-linear charging and discharging characteristics of the capacitor will introduce distortion in the output signal. This problem can be remedied by using current rather than voltage sources to charge and discharge the capacitor, but this makes the circuit more complex and produces additional noise on the triangle wave, noise which will also appear on the output signal.

Pulse duty cycle errors are also produced by any DC offset voltage of the triangle wave, any input offset voltage of the comparator, or if the response time in the comparator is different for negative versus positive transitions. These errors in duty cycle will cause a constant DC current in the output transducer, increasing power consumption and decreasing battery life. An output offset is also generated if the H-bridge transistors which conduct in one polarity have a different total on-state resistance than the H-bridge transistors which conduct in the opposite polarity.

Gain errors can also occur. Because the gain is dependent on the amplitude of the triangle wave, the gain is affected by the RC time constant and the frequency of the clock input to the integrator which generates the triangle wave. Variations in these two factors will therefore cause gain variations. Gain error will also result from variations in H-bridge switch resistance which result in less than the entire battery voltage appearing across the transducer load.

In other Class D amplification applications, output to input feedback has been utilized to correct some types of output signal aberrations. In U.S. Pat. No. 5,410,592 to Wagner et al., a state variable feedback circuit is disclosed which is designed to correct for differences in load impedance caused by different configurations and types of paging system loudspeakers. The system described in Wagner, however, is unsuitable for application to hearing aids where size constraints and concerns with power consumption and battery voltage levels are of crucial importance. Accordingly, a feedback circuit which can be successfully utilized in hearing aids is required. Preferably, such a circuit will correct the sources of distortion and gain errors described above without involving the complexity of other alternative solutions. Furthermore, the circuit should be made to be conveniently and inexpensively produced on an integrated circuit.

SUMMARY OF THE INVENTION

The performance of a hearing aid is enhanced in the present invention by including, as part of an audio amplification circuit, a Class D amplifier which incorporates output to input feedback to reduce distortion and stabilize gain. A hearing aid according to the present invention includes a summing amplifier having first and second inputs and an output; wherein one input to the summing amplifier is from an input transducer such as a microphone, and the output of the summing amplifier provides the input to a pulse width modulation circuit. Additionally provided is a feedback network connected from the output of the power switching output stage of the Class D amplifier to the second input of the summing amplifier. In the summing amplifier the signals are combined, with the output to the pulse width modulation circuit being an error signal which corrects for the distortion produced in the other elements of the amplifier system. The feedback loop also provides a circuit which minimizes any power dissipating DC offset at the output of the power switching output stage. To sum an input and feedback signal with different ground levels, the summing amplifier preferably comprises two substantially identical differential amplifiers having a common current mirror load. Most preferably, the differential amplifiers are implemented with CMOS transistors.

A feedback loop according to the present invention greatly relaxes the design requirements of other elements of the Class D amplifier system such as the triangle wave generator, the comparator, and the power switching output stage. Preferably, the feedback loop has a higher attenuation at higher frequencies than at lower frequencies, with a matching low-pass filter being provided at the audio signal input to the summing amplifier. This configuration provides a flat frequency response for the amplifier system over the audio frequency band.

DETAILED DESCRIPTION OF THE PREFERRED EMBODIMENT

The invention disclosed herein is best understood with reference to the accompanying Figures wherein like parts are designated with like numerals throughout.

Figure 1:
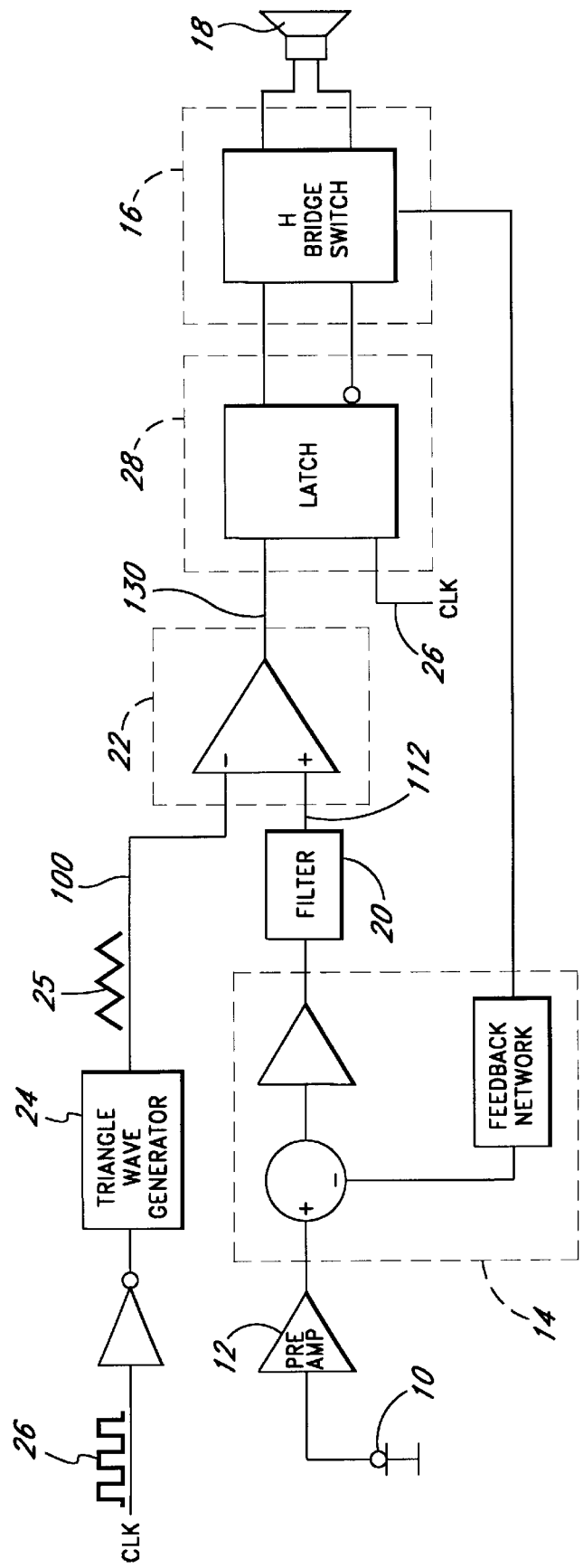
FIG. 1 is a block diagram of a preferred embodiment of a hearing aid incorporating a Class D amplifier which includes a feedback loop.

Accordingly, a block diagram of one preferred embodiment of a hearing aid amplifier incorporating the present invention is provided in FIG. 1. Due to the size constraints inherent in hearing aid design, the circuit elements shown in FIG. 1 (except for the microphone 10 and speaker 18) are preferably incorporated onto a single integrated circuit (IC). The improved hearing aid comprises an input transducer 10, such as a microphone, which provides an electrical signal input to a preamplifier 12. The specific properties of the preamplifier 12 are not essential to achieving the benefits of the present invention. However, it preferably incorporates output signal compression at high input signal amplitudes as well as an output limiter. Most preferably, the preamplifier 12 is constructed in accordance with the teachings of the related and co-pending U.S. Pat. application entitled "TRIMMABLE VARIABLE COMPRESSION AMPLIFIER FOR HEARING AID", filed concurrently herewith, and having the present inventor as one co-inventor. The disclosure of the "TRIMMABLE VARIABLE COMPRESSION AMPLIFIER FOR HEARING AID" application is hereby incorporated by reference in its entirety.

The output of the preamplifier 12 provides the input to a summing amplifier 14, which, as is described in more detail below, also receives an input from the power amplifying H-bridge switch 16 which drives the output transducer 18, typically comprising a speaker. The output of summing amplifier 14 is passed through a filter 20, and then into the positive input of a pulse width modulation circuit which preferably comprises a comparator 22. The negative input to the comparator 22 is generated by a triangle wave generator 24. The output of the comparator 22 is therefore high when the input signal is higher than the value of the triangle wave 25, and low when the input signal is lower than the value of the triangle wave 25. Because the frequency of the triangle wave 25 is much higher than the highest audible frequency, the audio band input appears essentially as a varying DC signal input, and the output of the comparator 22 comprises a pulse train with a duty cycle proportional to the instantaneous input signal level. Triangle wave frequency of 70–200 kHz are generally suitable for use in Class D amplifiers implemented in hearing aids, with 150 kHz being utilized in one preferred embodiment of the present invention.

In contrast to prior art hearing aids, improved amplifier performance can be achieved without increasing the complexity of the triangle wave generator 24. In the preferred embodiment, a triangle wave is generated by applying a square wave 26 of appropriate frequency (that is, 70 to 100 kHz) to one terminal of a resistor (not shown) which is connected to circuit common through a capacitor (not shown). The triangle wave signal is then taken from the common node of the resistor and capacitor. The square wave itself may be generated in many ways well known to those in the art. Crystal oscillators are generally unsuitable in hearing aids due to their size. Because it is not necessary to control the frequency to an accuracy greater than about 5%, simple RC astable multivibrator circuits are preferably used to generate the clock signal, wherein the output frequency is dependent on the RC time constant. As process variations during integrated circuit manufacture can make the RC time constant vary widely from chip to chip, it is advantageous to include series trimming resistances and parallel trimming capacitors. These can be made to be independently switched into or out of the RC circuit with MOSFET transistors utilizing techniques well known to those in the art, and will create the ability to produce an increased consistency in RC time constant among different IC production lots.

The clock input to the triangle wave generator 24 preferably uses the battery voltage of 1.0 to 1.5 volts as its positive rail. Also, for reasons which will become apparent below with reference to FIG. 4, the clock signal 26 is preferably inverted prior to be input to the triangle wave generator 24. The time constant of the RC integrator is preferably chosen so that the triangle wave generated has a peak to peak voltage swing from approximately 0.25 times the battery voltage to 0.75 times the battery voltage. As with the RC network used to generate the clock, trimming resistors and capacitors are preferably provided to compensate for process variations during IC manufacture.

It is one aspect of the present invention that the shape and amplitude of the triangle wave need not be precisely controlled. Distortion introduced by non-linearites in charging and discharging will be corrected by the feedback loop. Furthermore, as long as the open loop gain is much higher than the closed loop gain, the Class D amplifier of the present invention has gain governed by the attenuation in the feedback loop rather than by the amplitude of the triangle wave 25. For this reason, control over triangle wave 25 amplitude is not critical. It has been observed that distortion is improved somewhat by reducing the triangle wave 25 amplitude, and this is likely attributable to the resulting increase in open loop versus closed loop gain.

Referring again to FIG. 1, the approximately triangular waveform produced by triangle wave generator 24 is compared with the filtered output signal from the summing amplifier 14 in the comparator 22 to produce a pulse train with duty cycle related to the signal level being output from the summing amplifier 14. This pulse train is input to a latch 28 which converts the single ended comparator output to a differential signal input to an H-bridge switch which in turn drives the output transducer 18. The latch 28 does not modify the duty cycle of the comparator output but performs two other functions. It ensures first that no high frequency oscillations which may occur near comparator state transitions oscillating signals are presented to the H-bridge switch 16. The latch 28 also ensures that the outputs to the H-bridge switch never overlap. In accordance with the present invention, a feedback connection is provided from the H-bridge switch 16 back to the summing amplifier 14.

Figure 2:
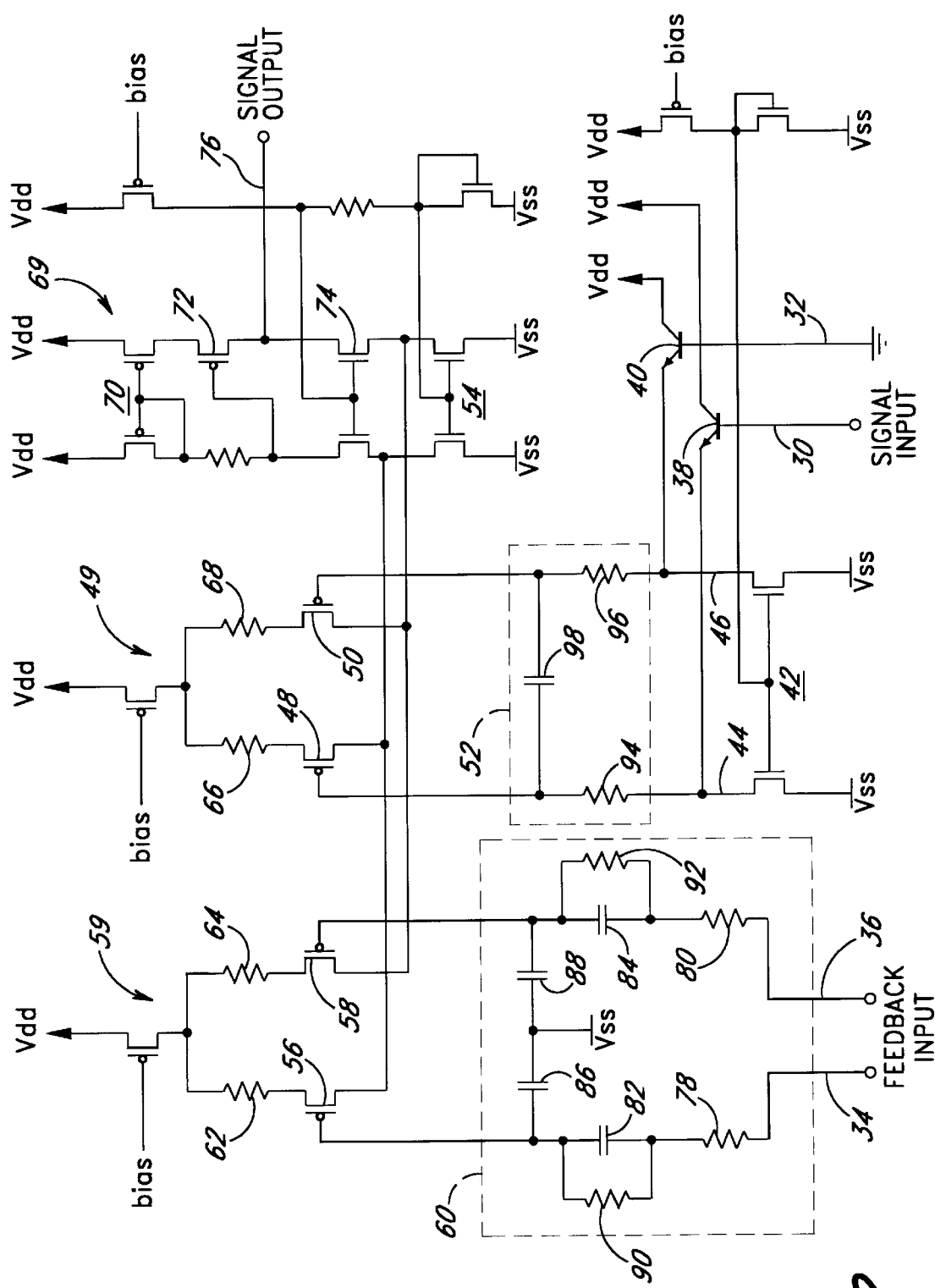
FIG. 2 is a schematic diagram of a preferred summing amplifier according to the present invention.

FIG. 2 is a schematic diagram of a preferred summing amplifier for generating the error signal from an audio input presented at nodes 30 and 32 and a feedback signal presented at nodes 34 and 36. Throughout this specification and in the Figures, power supply rails generated by the power supply are denoted by $V_{ss}$, which is tied to the negative battery terminal, and $V_{dd}$, which, via a voltage doubler circuit not shown, is approximately 2.0 to 2.9 Vdc (i.e. double the battery voltage of 1.0 to 1.5 volts minus approximately 0.1 volt). A signal ground is also provided by a voltage divider in the power supply, and is preferably held at approximately 0.86 times the battery voltage. Bias potentials are developed using techniques well known to those in the art.

Preferably, the negative audio input at node 32 is tied to signal ground, and the positive input at node 34 comprises a single ended output from the preamplifier 12 which is referenced to the signal ground. This input is initially amplified by bipolar transistors 38 and 40, connected in an emitter-follower configuration into a current mirror 42. The resulting voltage input present at nodes 44 and 46 is applied through a low pass filter 52 to a p-channel MOSFET differential pair comprising transistors 48 and 50. The signal input differential transistor pair 48, 50 feeds a current mirror load 54.

Figure 5:
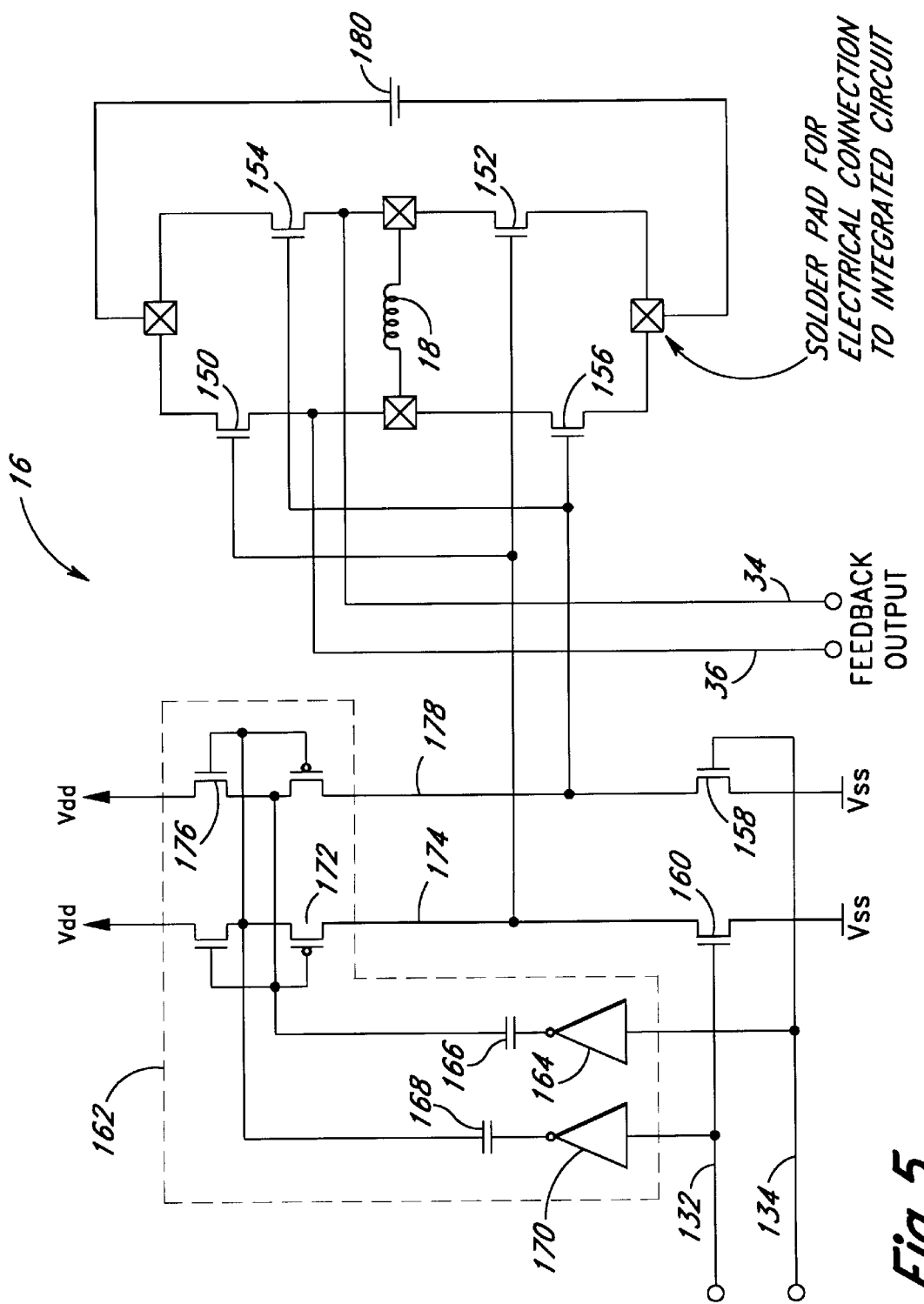
FIG. 5 is a schematic diagram of a preferred power amplifying H-bridge switch for use in preferred hearing aid Class D amplifier according to the present invention.

Also utilizing the current mirror 54 as a load is another differential pair of p-channel MOSFET transistors 56, 58. This transistor pair 56, 58 receives input from feedback input nodes 34 and 36 through another low pass filter 60. Feedback input nodes 34, 36 are also shown in FIG. 5, where it can be seen that they connect across the output transducer 18 being driven by the H-bridge switch 16.

Both the input amplifier 49 comprising transistors 48 and 50 and the feedback amplifier 59 comprising transistors 56 and 58 are substantially identical MOSFET implemented linearized transduction amplifiers with matched differential input transistors 48, 50, 56, 58 and drain resistances 62, 64, 66, 68. This configuration allows input and feedback summing even though the feedback signal has rails at $V_{bat}$ and $V_{ss}$ (i.e. feedback ground is 0.5 times $V_{bat}$) and the input signal has rails at $V_{dd}$ and $V_{ss}$ (i.e. input ground is at the signal ground of 0.86 times $V_{bat}$).

The output stage 69 of the summing amplifier 14 also sources current into the common current mirror load 54 of the feedback and input amplifiers 59, 49 from p-channel MOSFET current mirror 70. It can therefore be appreciated that if the differential input signal at node 30 changes, and this change is not adequately tracked by the feedback signal at nodes 34 and 36, the current in the branches of current mirror 54 will lose balance unless the potential at the output node 76 changes and forces current into or out of node 76 until the current imbalance is corrected, thereby producing an amplified error signal. Transistors 72 and 74 are provided in a cascode configuration to increase the output impedance of the output stage.

As will be seen below with reference to FIG. 5, the feedback input is tied directly across the output transducer 18. The feedback input at nodes 34 and 36 is therefore a square wave of varying duty cycle with a positive pulse amplitude of $V_{bat}$. To prevent these pulses from saturating the feedback amplifier 59, they are low pass filtered by filter 60, which is comprised of series resistors 78 and 80, series capacitors 82 and 84, bypass resistors 90 and 92 which are connected across series capacitors 82 and 84, and shunt capacitors 86 and 88 which are connected to $V_{ss}$.

Bypass resistors 90 and 92, which preferably have a resistance of approximately 300 megohms, ensure that any DC offset component of the output signal is passed to the gates of differential pair 56 and 58 without attenuation. Thus, the feedback loop corrects for many causes of DC offset at the output transducer. In the comparator, for example, any input offset and any differences in positive and negative response time will be compensated. Also, resistance differences in the two pairs of output transistors in the H-switch bridge, in addition to any DC offset in the triangle wave generator will be compensated. Consequently, an output offset at the output transducer 18 which is accompanied by undesireable battery drain can be minimized by minimizing the input offset of solely the summing amplifier. Furthermore, any noise in the audio band introduced into the signal by these other elements of the Class D amplifier will be compensated for by the feedback loop. Noise levels are therefore dependent almost exclusively on the noise in the summing amplifier. The feedback loop will therefore greatly relax the design and fabrication requirements for the other elements of the Class D amplifier system.

To prevent saturation, capacitors 82, 84, 86, and 88 provide an AC attenuation of preferably about 12 dB, it being suitable, for example, to provide a capacitance of 10 pf for series capacitors 82 and 84, and 30 pf for shunt capacitors 86 and 88. Because this feedback attenuation increases the gain of the summing amplifier at higher frequencies, a low pass filter 52 is included at the signal input to create a flatter frequency response of the summing amplifier throughout the audio band. If the feedback attenuation network 60 is provided as described above, a preferable signal input low pass filter 52 includes series resistors 94 and 96 of about 200 kohm, and a shunt capacitor 98 of about 20 pf.

As was seen in FIG. 1, the output of the summing amplifier, which is dependent on the difference between the feedback signal at nodes 34 and 36 and the input signal at nodes 30 and 32, provides the positive input to the pulse width modulating comparator 22 through a filter 20. This is shown in more detail in FIG. 3. The error signal at node 76 is first passed through a filter 20, preferably of the type shown in FIG. 3. Filter 20 further removes high frequency components introduced by the feedback signal at nodes 34 and 36 and helps stabilize the feedback loop. Various filter configurations may be employed. In one preferred embodiment, resistors 102 and 104 are approximately 1.5 megohms, resistor 110 has a value of approximately 150 kohm, capacitor 106 is about 10 pf, and capacitor 108 is about 30 pf.

Figure 3:
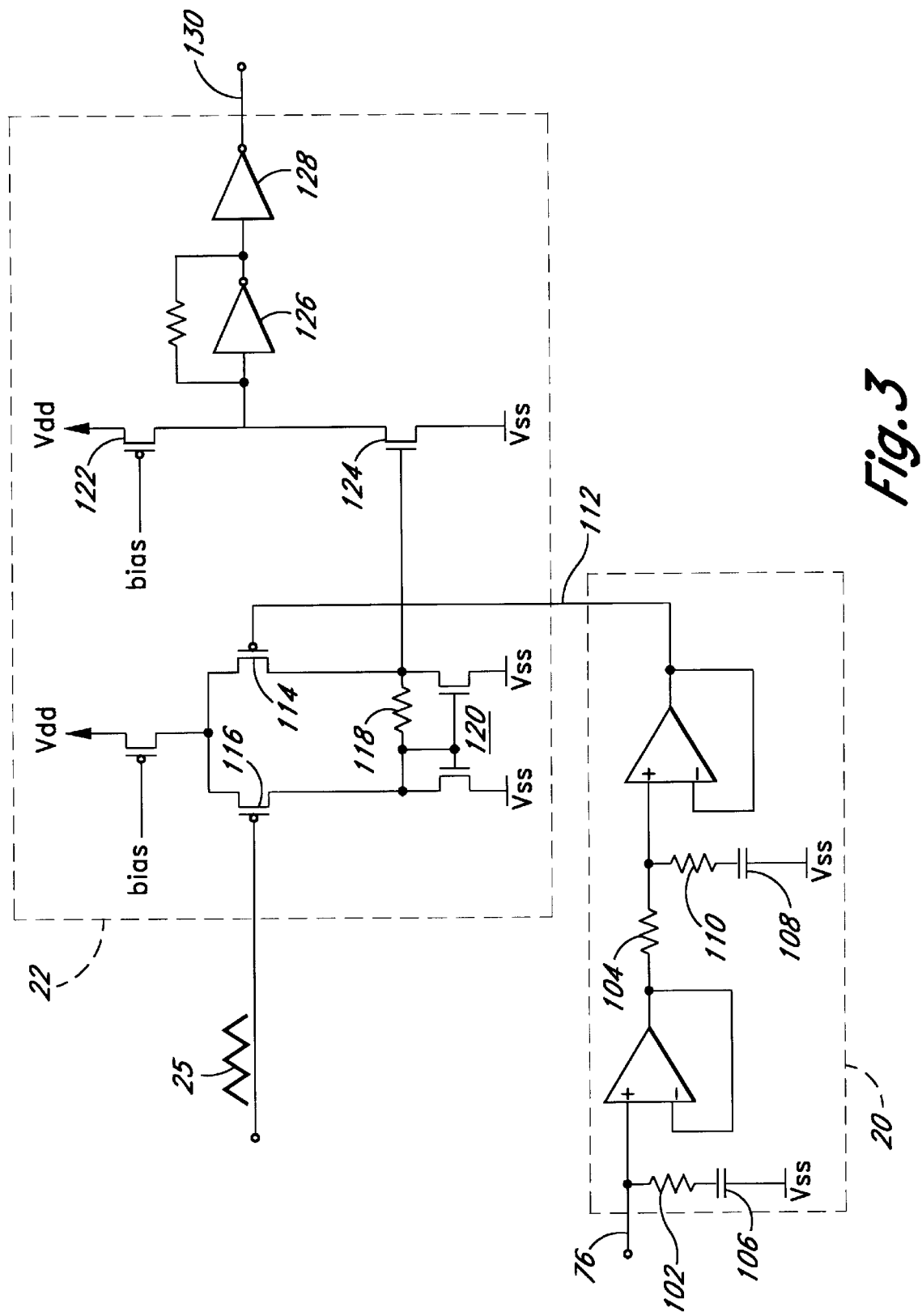
FIG. 3 is a schematic diagram of a preferred filter and comparator for use in a Class D amplifier incorporating a feedback loop.

The output of the filter 20 at node 112 provides an input to a simple two stage comparator circuit 22. The signal input at node 112 is connected to the gate of a p-channel MOSFET 114 which forms a differential pair with another p-channel MOSFET 116. The gate of transistor 116 receives the triangle wave 25 from the triangle wave generator 24 described in conjunction with FIG. 1. A resistor 118 is provided between the first stage output and the common gates of the n-channel transistors comprising current mirror load 120 which increases the bandwidth and therefore the response time of the first stage. Gain is accordingly reduced, but this is not of particular concern. In a preferred comparator as shown in FIG. 3, a two MOSFET second stage comprising transistors 122 and 124 drive a pair of inverters 126, 128 connected in series. The inverters 126, 128 provide further gain increases, thereby decreasing the rise time of the comparator 22 output pulses.

The comparator output at node 130 is therefore a pulse train with duty cycle determined by the input signal level at node 112. As is illustrated in the block diagram of FIG. 1, this output 130 provides the input to a latch 28 which takes the single ended comparator output at node 130 and creates a differential output wherein the two latch output nodes 132 and 134 are non-overlapping alternately high and low outputs depending on the state of the comparator 22 output.

Referring back to FIG. 1, it may be recalled that the clock signal 26 is inverted prior to being used to create the triangle wave 25. The non-inverted clock signal 26 provides a second input to the latch 28. Because the positive slope portion of the triangle wave coincides with a positive pulse period of the inverted clock signal, comparator 22 transitions from low to high only occur when the non-inverted clock signal 26 is high. Similarly, comparator 22 transitions from high to low only occur when the non-inverted clock signal 26 is low.

Figure 4:
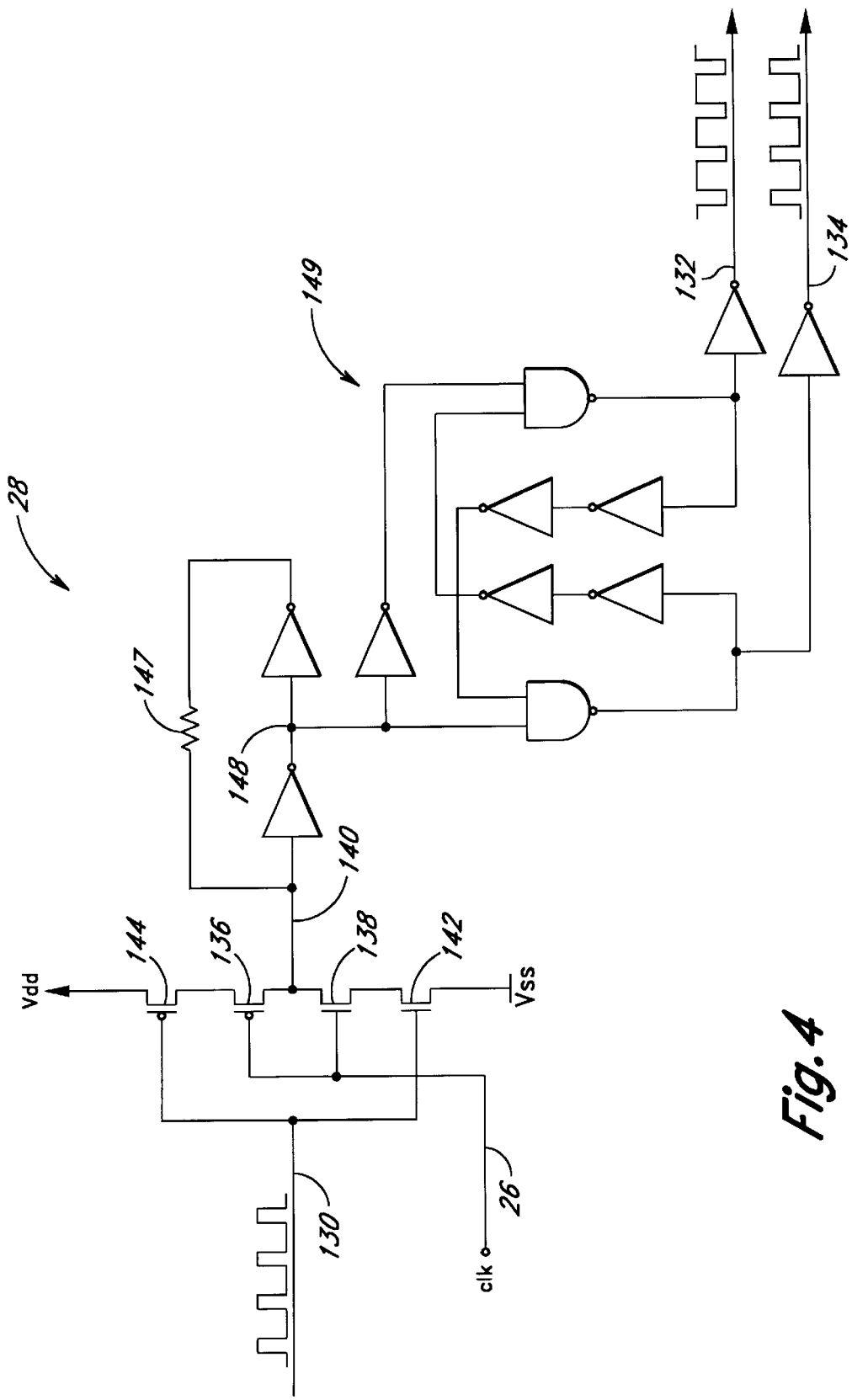
FIG. 4 is a schematic diagram of a latch circuit incorporated in a preferred hearing aid Class D amplifier according to the present invention.

Referring now to FIG. 4, it is seen that the clock signal 26 is tied to the gates of a p-channel MOSFET 136 and an n-channel MOSFET 138. These transistors prevent oscillations in the comparator output from altering the logical state of node 140. When the clock signal 26 is high (transistor 138 on, transistor 136 off), node 140 can only make a transition from high to low upon a comparator state change from low to high which turns on transistor 142. Conversely, when the clock signal is low (transistor 136 on, transistor 138 off), node 140 can only make a transition from low to high upon a comparator state change from high to low which turns on transistor 144. All other comparator state changes are isolated from node 140 by the clock connected transistor 136, 138 which is in the off state. Therefore, any oscillations which may occur at the comparator output 130 near each comparator state change are rejected, and node 140 remains latched in its previous state by resistor 146 until the next legitimate comparator transition during the next clock half cycle.

As described above, the signal at node 140 is the inverse of the comparator output at node 130. Accordingly, the signal output is taken from node 148 after another inversion, whereupon node 148 and its inverse provide the input to a NAND gate S-R flip flop 149. When the flip-flop 149 outputs are again inverted, the signal at output node 134 follows the comparator output at node 130, while the signal at output node 132 is the inverse of the comparator output at node 130. The S-R flip flop 149 provides a delay which ensures that one output 132, 134 goes high before the other output 134, 132 goes low. This prevents any low output signal overlap on nodes 132 and 134 which would cause, as may be seen by referring to FIG. 5, an H-bridge switch 16 short circuit across the hearing aid battery 180 terminals.

The two outputs 132, 134 of the latch illustrated in FIG. 4 are then supplied to the H-bridge switch 16. A schematic for a preferred H-bridge switch 16 is shown in FIG. 5. The H-bridge switch 16 shown in FIG. 5 comprises four n-channel power switching MOSFETs 150, 152, 154, and 156 which are interconnected with the output transducer 18 and a battery power source 180 in a manner well known in the art. When the comparator output at node 130 goes high, input node 134 goes high as well, and input node 132 goes low. This switches on transistor 158, thereby turning off transistors 154 and 156. Bootstrap circuit 162 then generates a gate voltage on power switching transistors 150 and 152 which is higher than $V_{dd}$. This is done by connecting previously charged capacitor 168 to node 174 through p-channel MOSFET 172 when the output of inverter 170 goes high.

When transistors 150 and 152 are turned on, current from the positive terminal of the battery 180 flows from the source of transistor 150, through output transducer 18 (shown in FIG. 5 as an inductor), and back to the negative terminal of the battery 180 from the source of transistor 152. Providing a gate voltage to transistors 150 and 152 which exceeds $V_{dd}$ ensures that they are fully saturated in the on state, and minimizes the resistance they introduce into the battery/transducer circuit.

During this high period of the output of the comparator 130, the charge on capacitor 166 is maintained by its connection to $V_{dd}$ through transistor 176 with the output of inverter 164 at $V_{ss}$. When the output of the comparator 130 then makes a transition from high to low, this capacitor 166 is connected to node 178 with the output of the inverter 164 at $V_{dd}$, thereby turning on transistors 154 and 156 with a gate voltage higher than $V_{dd}$ in a manner analogous to that described with respect to transistors 150 and 152. Thus, an application of battery voltage in the opposite polarity across the output transducer 18 is produced when the comparator is in the low state.

As has been stated above, it is one aspect of the present invention to provide feedback from the H-bridge switch 16 back to the summing amplifier 14. This is seen in FIG. 5 wherein feedback nodes 34 and 36 are seen connected to the sources of transistors 154 and 150 respectively. These nodes 34, 36 are also shown in FIG. 2 as inputs to the summing amplifier 14. As illustrated with respect to FIG. 4, feedback node 32 follows the inverse of the comparator output. It may be noted by referring back to FIG. 2 that feedback node 34 adds with the signal input node 30 in the summing amplifier via common current mirror 54. This produces the desired feedback signal subtraction as is described above in detail with reference to FIG. 2.

The foregoing description details certain preferred embodiments of the present invention and describes the best mode contemplated. It will be appreciated, however, that no matter how detailed the foregoing appears in text, the invention can be practiced in many ways and the invention should be construed in accordance with the appended Claims and any equivalents thereof.

What is claimed is:

1. A hearing aid comprising in combination:

a battery having a negative terminal defining a circuit common $V_{ss}$ and a positive terminal defining a first positive rail $V_{bat}$;

a power supply circuit coupled to said battery defining a second positive rail $V_{dd}$ which is higher than $V_{bat}$;

an input transducer coupled to a pre-amplifier to produce an analog audio signal varying between $V_{ss}$ and $V_{dd}$, thereby defining a first signal ground approximately midway between $V_{ss}$ and $V_{dd}$;

an output transducer;

a summing amplifier having first and second inputs and output, wherein said first input comprises said audio signal;

a pulse width modulation circuit having an input and an output, wherein said pulse width modulation circuit input is connected to said output of said summing amplifier, and wherein said pulse width modulation circuit output drives said output transducer with a pulsed voltage varying between $V_{ss}$ and $V_{bat}$ thereby defining a second signal ground approximately midway between $V_{ss}$ and $V_{bat}$; and, a feedback network having an input and an output, wherein said feedback network input is connected across said output transducer such that said feedback network input receives only said pulsed voltage, wherein said feedback network output is connected to said second input of said summing amplifier, and wherein said summing amplifier is configured to generate an error signal which is substantially independent of a difference between said first and second signal grounds.

2. The hearing aid of claim 1 wherein said summing amplifier comprises at least two substantially identical differential amplifiers having a common current mirror load.

3. The hearing aid of claim 2 wherein said summing amplifier is implemented with CMOS transistors.

4. The hearing aid of claim 1 wherein said feedback network comprises a low pass filter with attenuation substantially less at frequencies below an audio band than at frequencies above the audio band.

5. The hearing aid of claim 4 additionally comprising a low pass filter connected to the output of said input transducer.

6. The hearing aid of claim 1, wherein said pulse width modulation circuit comprises:
   a plurality of power switching MOSFET transistors; and
   a bootstrap circuit coupled to gates on said MOSFET transistors such that said gates are driven at a voltage higher than $V_{dd}$ so as to reduce on-state resistance of said MOSFET transistors.

* * * * *